(12) United States Patent
Hata

(10) Patent No.: US 6,660,973 B2
(45) Date of Patent: Dec. 9, 2003

(54) RADIANT HEATING APPARATUS AND DISCHARGE CURRENT DETECTING CIRCUIT THEREFOR

(75) Inventor: Hiroshige Hata, Himeji (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/326,154

(22) Filed: Dec. 23, 2002

(65) Prior Publication Data

US 2003/0121901 A1 Jul. 3, 2003

(30) Foreign Application Priority Data

Dec. 28, 2001 (JP) ........................................ 2001-398961

(51) Int. Cl.[7] ................................................. F27B 5/14
(52) U.S. Cl. ...................... 219/390; 219/405; 219/411; 392/416; 392/418; 118/724; 118/725
(58) Field of Search ................................ 219/390, 405, 219/411; 392/416, 418; 118/724, 725, 501

(56) References Cited

U.S. PATENT DOCUMENTS 4,567,352 A * 1/1986 Mimura et al. ............. 219/405
4,649,261 A * 3/1987 Sheets ........................ 219/390
4,698,486 A * 10/1987 Sheets ..................... 250/492.2
4,859,832 A * 8/1989 Uehara et al. .............. 219/411

FOREIGN PATENT DOCUMENTS

| JP | 2002-57301 | 2/2002 |
| JP | 2002-141298 | 5/2002 |
| JP | 2002-151428 | 5/2002 |

* cited by examiner

*Primary Examiner*—Shawtina Fuqua
(74) *Attorney, Agent, or Firm*—Rader, Fishman & Grauer PLLC

(57) ABSTRACT

A radiant heating apparatus for heating one or more workpieces, comprises at least one flash discharge lamp, a discharge circuit having a condenser, connected in series to the at least one flash discharge lamp, for supplying voltage to the at least one flash discharge lamp; and a non-contact current detecting sensor provided in the discharge circuit wherein the current detecting sensor detects in a non-contact state discharge current flowing through the discharge circuit whereby it is possible to compensate condenser deterioration and also it is possible to detect an abnormal state of the discharge circuit based on outputs from the non-contact current detecting sensor.

4 Claims, 4 Drawing Sheets

RADIANT HEATING APPARATUS AND DISCHARGE CURRENT DETECTING CIRCUIT THEREFOR

BACKGROUND OF THE INVENTION

1. Technical Field of the Invention

The present invention relates to a radiant heating apparatus for heat-treating one or more workpieces such as semiconductor boards or liquid crystal boards by a flash from a flash discharge lamp, and especially to a radiant heating apparatus having a discharge current detecting circuit.

2. Description of Related Art

A radiant heating apparatus that heat-treats workpieces such as semiconductor wafers by a flash light simultaneously emitted from a plurality of rod-shaped flash discharge lamps has been developed.

In a flash circuit of a conventional flash discharge lamp for a radiant heating apparatus, alternating voltage supplied from an alternating voltage power source is converted to direct current voltage by a rectifier smoothing circuit. After the direct current voltage is converted to alternating voltage via a chopper circuit by an inverter circuit, the alternating voltage is boosted by a boosting transformer and then is converted to high direct current voltage by a high voltage rectifier smoothing circuit, by which a discharge condenser is charged by the high direct current voltage. By triggering the flash discharge lamp by a trigger signal generated by a trigger circuit, the charged high direct current voltage is discharged, thereby, the flash discharge lamp emits a flash light.

However, the more the lash discharge lamp is used, the more the capacity of the condenser for such a flash circuit become lower. When the capacity of the condenser drops, then the intensity of radiation lowers, therefore, it is difficult to properly heat-treat workpieces.

In a radiant heating apparatus having a plurality of flash discharge lamps, an appropriate distance between a plurality of flash discharge lamps and workpieces is maintained. The flash discharge lamps emit a flash light simultaneously to obtain an appropriate light output, thereby, semi-conductor etc. is uniformly heated. Thus, in the radiant heating apparatus having the plurality of flash discharge lamps, if light output from one of the discharge lamps drops, the flash discharge lamps would not uniformly heat-treat the semiconductor.

In general, light output energy E is represented by $E=QV/2=CV^2/2$ wherein the quantity of charges, the capacity of the discharge condenser, and the charged voltage of the discharge condenser is Q, C, and V respectively. A drop of light output caused by a drop of the condenser capacity is compensated by raising charged voltage V.

To raise the charged voltage V, it is necessary to know how much the capacity of the charged condenser has dropped. The capacity C may be measured by connecting a measuring device (an LCR meter etc.) to the both ends of the discharge condenser.

However, the capacity of the condenser built in the high voltage rectifier smoothing circuit is measured in addition to the capacity C. Further, in case that charges in the discharge condenser remains therein since the flash discharge lamp does not emit a flash, there is a possibility that a discharge accident occurs if the measuring device is connected to the condenser.

SUMMARY OF THE PRESENT INVENTION

It is an object to measure discharge current without contacting a discharge circuit.

It is further object to compensate capacity drops of a discharge condenser.

It is still further object is to alert to an abnormal state of a discharge circuit.

The present invention provides a radiant heating apparatus for heating one or more workpieces, comprising at least one flash discharge lamp, a discharge circuit having a condenser, connected in series to the at least flash discharge lamp, for supplying voltage to the at least one flash discharge lamp, and a non-contact current detecting sensor provided in the discharge circuit wherein the current detecting sensor detects in a non-contact state discharge current flowing through the discharge circuit.

Accordingly, it is possible to detect changes of flash amount by measuring a large amount of current in a non-contact state The radiant heating apparatus may include a power source controlling circuit wherein the power source controlling circuit controls voltage charged in the condenser based on a value detected by the non-contact current detecting sensor.

It is possible to maintain the desired flash amount by compensating changes of the flash amount caused by deterioration of the condenser whereby it is possible to uniformly heat-treat one or more workpieces by each of the flash discharge lamps.

The radiant heating apparatus may include a display circuit wherein the display circuit alerts to an abnormal state of the discharge circuit based on a value detected by the no-contact current detecting sensor.

Therefore, it is possible to alert to an abnormal state of the discharge circuit by the display circuit.

The present invention further provide a discharge current detecting circuit for a radiant heating apparatus that heats one or more workpieces by a flash emitted from at least one flash discharge lamp, a condenser, connected in series to the at least flash discharge lamp, for supplying voltage to the at least one flash discharge lamp; and a non-contact current detecting sensor provided in the discharge circuit wherein the current detecting sensor detects in a non-contact state discharge current flowing through the discharge circuit.

BRIEF DESCRIPTION OF THE DRAWINGS

The present inventions will now be described by way of example with reference to the following figures in which.

DETAILED DESCRIPTION OF THE PREFERRED EMBODIMENTS

Description of embodiments according to the present invention will be given referring to FIGS. 1 to 4.

As discussed above, when the light output of the one or more flash discharge lamps drops, there is a problem that the flash discharge lamps may not heat workpieces.

Therefore, it is necessary to raise the charged voltage V to compensate the capacity drops. To raise the charged voltage V, it is necessary to know how much the capacity of the charged condenser has dropped. The capacity C may be measured by connecting a measuring device (an LCR meter etc.) to the both ends of the discharge condenser. However, the capacity of the condenser built in the high voltage rectifier smoothing circuit is measured in addition to the capacity C.

Figure 4:
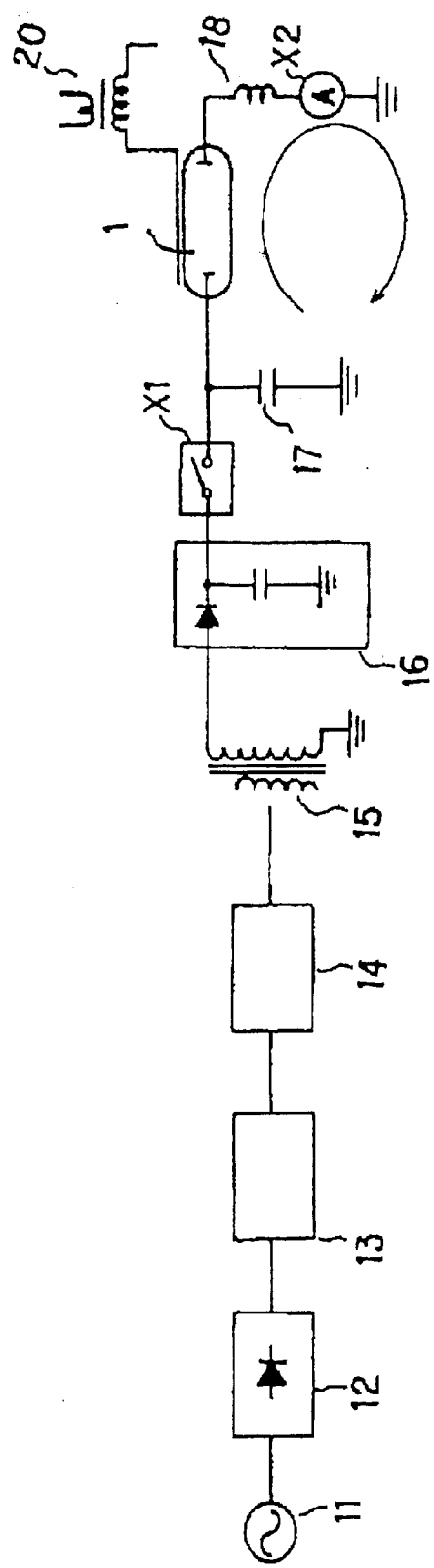
FIG. 4 shows a conventional flash discharge lamp lighting circuit.

It is possible to measure only the capacity C of the discharge condenser 17 by inserting a relay contact at a position X1 as shown in FIG. 4 and thereby separating the discharge condenser 17 and the rectifier smoothing circuit 16. However, since the discharge voltage is very high such as a couple of KV, the relay requires a high voltage durability. Therefore, it causes cost-up of the relay or it is difficult to make the relay small. Furthermore, if the relay does not work properly, the relay contact would melt. As a result, the discharge circuit would not work properly.

Thus, there are many problems to measure the capacity C of the discharge condenser and there has not been any solution for the problem.

On the other hand, it is possible to indirectly measure capacity drops of the discharge condenser 17 by measuring discharge current instead of directly measuring the capacity C of the discharge condenser 17.

Wherein the capacity of the discharge condenser 17, inductance inserted in the discharge circuit, synthesized resistance component (a sum of a resistance component of the flash discharge lamp and the other resistance component), total impedance of the discharge circuit, the voltage charged in the discharge condenser, time from the beginning of discharge is represented as L, R, Z, $V_o$ and t respectively, the discharge current "i" is represented as follows:

$$Ldi/dt+Ri+(1/C)\int i\, dt=0.$$

The peak value Ip of the discharge current "i" is calculated by the following formulas:

$$Ip=V_0*(\exp(n_1*t_o)-\exp(n_2*t_o)/(L(n_1-n_2))$$

$$n_1=-A+\sqrt{B}$$

$$n_2=-A-\sqrt{B}$$

$$A=Z/2L$$

$$B=(Z/2L)^2-1/LC$$

$$t_o=L_n(n_2/n_1)/(n_1-n_2)$$

As obvious from these formulas, the peak value Ip is determined by the charged voltage $V_o$ and the capacity C of the discharge condenser if the inductance L and the state of the flash discharge lamps does not change. Therefore, to compensate the capacity drops of the discharge condenser, it is possible to adjust the peak value Ip of the discharge current by adjusting voltage $V_o$.

To measure the discharge current "i", an ammeter is be connected to a certain point such as a position X2 as shown in FIG. 4. However, since a discharge time of the flash discharge lamp 1 used for this kind of radiant heating apparatus is short such as a couple of micro seconds and the discharge current reaches to a couple of hundred to a couple of thousand amperes, it is difficult to measure the discharge current in such place by the ammeter.

Figure 1:
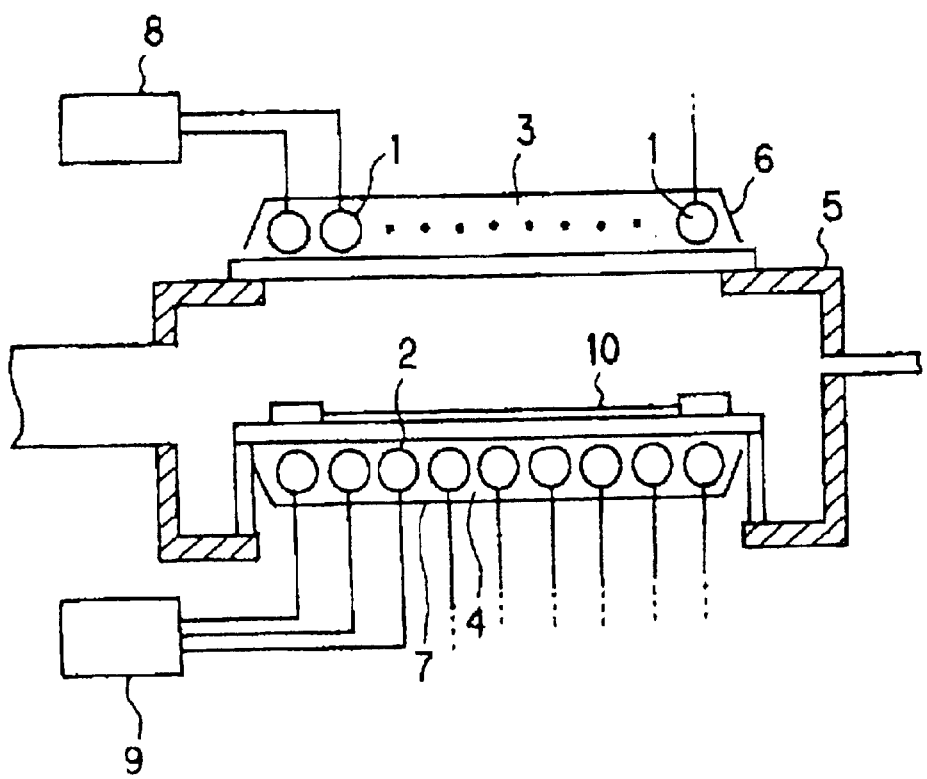
FIG. 1 is a sectional view of a radiant heating apparatus according to the present invention.

FIG. 1 is a schematic view of a radiant heating apparatus in the present invention.

In FIG. 1, a plurality of flash discharge lamps 1 are parallelly arranged on the same plan above a chamber 5. The group of the flash discharge lamps are denoted by 3. A plurality of white lamps 2 are provided on a lower portion of the chamber 5 to pre-heat the one or more workpieces. The group of the white lamps are denoted by 4. An upper reflector 6 is provided to reflect a flash light from the flash discharge lamps downward. A lower reflector 7 is provided to reflect light from the white lamps 4 upward. A flash discharge lamp lighting circuit 8 is connected to the plurality of flash lamps 4. A white lamp lighting circuit 9 is connected to the plurality of the white lamps 5. The one or more workpiece 10 is placed above the plurality of white lamps 5. The workpiece may comprise one or more semiconductor boards, liquid crystal boards, circuit boards or wafers.

Figure 2:
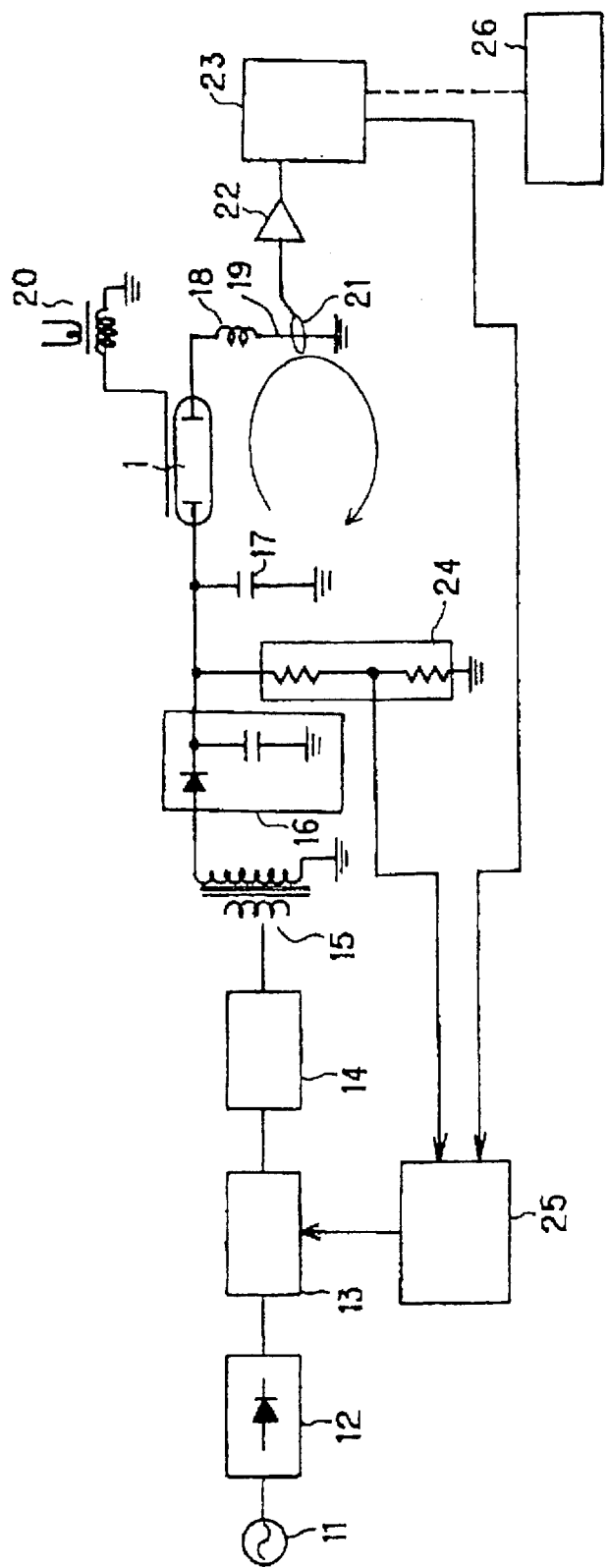
FIG. 2 shows a flash discharge lamp lighting circuit according to the present invention.

FIG. 2 shows a flash discharge lamp lighting circuit 8 for lighting the flash discharge lamp 1.

In FIG. 2, alternating voltage from an alternating current power source 11 is rectified by a rectifier smoothing circuit 12. The direct current voltage outputted from the rectifier smoothing circuit 12 is chopper-controlled by a chopper circuit 13. The voltage outputted from the chopper circuit 13 is converted to alternating voltage by an inverter circuit 14. The alternating voltage outputted from the inverter circuit 14 is raised to high alternating current voltage by a transformer 15. The high alternating current voltage is rectified so as to be converted to high direct current voltage by high voltage rectifier smoothing circuit 16. A condenser 17 is charged by the high direct current voltage supplied from the high voltage rectifier smoothing circuit 16. When the flash discharge lamp 1 emits a flash light, the condenser 17 and flash discharge lamp 1 is connected in series. An inductance is denoted by 18. A trigger circuit 20 generates a trigger signal for flash discharge of the flash discharge lamp 1. A current detecting sensor 21 is provided in an arbitrary position of the discharge circuit 19 and detects discharge current when the flash discharge lamp 1 emits a flash light. The amplifier 22 amplifies a value detected by the current detecting sensor 21. A processor 23 comprising CPU etc. outputs the value as a desired detected signal(s) and a power source controlling circuit 25. The power source controlling circuit 25 compares a signal(s) detected by a voltage detecting device 24 with the detected signal(s) outputted from the processor 23, and outputs a controlling signal(s) for controlling the chopper circuit 13.

Figure 3:
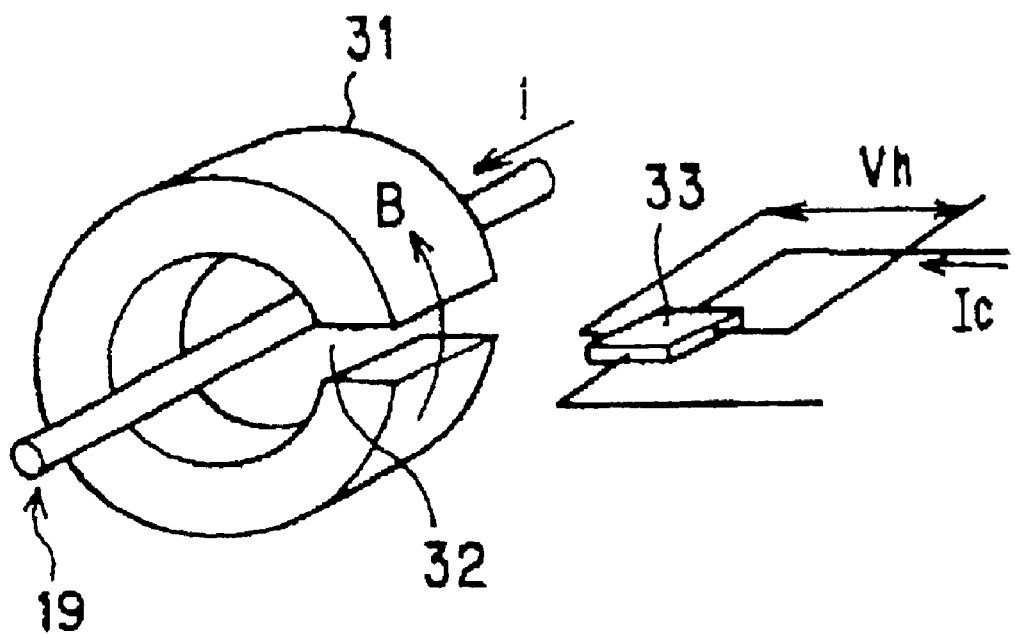
FIG. 3 shows a current detecting sensor 21 shown in FIG. 2.

FIG. 3 shows a perspective view of the current detecting sensor 21.

Part of a conductor of the discharge circuit 19 penetrates the inner space of a magnetic core 31 in a non-contact state. The magnetic core 31 has a gap 32. The reference number 33 denotes a Hall element.

When through current (discharge current of the discharge circuit 19) "i", flows in the magnetic core 31, magnetic flux is generated in proportion to the discharge current "i". The generated magnetic flux converges at the magnetic core 31. As known as the Hall effect, Hall voltage Vh is generated by the Hall effect in the Hall element 33 inserted in the gap 32. A detected value in proportion to the discharge current "i" is detected by detecting the Hall voltage Vh.

Description of an operation of the lighting circuit will be given.

Before the flash discharge lamp 1 emits a flash light, the condenser 17 is charged by the high direct current voltage obtained from alternating current voltage supplied by the power source 11 via the rectifier smoothing circuit 12, the chopper circuit 13, the inverter 14, the boosting transformer 15 and high voltage rectifier smoothing circuit 16.

When a trigger signal is supplied to the flash discharge lamp by the trigger circuit 20, discharge voltage charged in the condenser 17 is rapidly discharged via the flash discharge lamp 1. In the discharge circuit 19, the discharge voltage is discharged as oscillation waves having a desired peak value by the condenser 17 and the inductance 18, thereby the flash discharge lamp 1 emits a desired flash.

When the flash discharge lamp 1 emits a flash, the discharge current "i" flows into the discharge circuit 19 and the current detecting sensor 21 detects the discharge current "i" without contact with the discharge circuit 19. Therefore, since the current detecting sensor does not directly detect the discharge current "i", it is possible to detect a large amount of discharge current "i".

The hall voltage Vh detected by the current discharge sensor 19 is amplified by the amplifier 22 and the amplified voltage is sent to the power source controlling circuit 25 as a voltage signal(s) via the processor 23. Further, the power source controlling circuit 25 compares, a voltage signal(s) detected by the voltage detecting device 24 comprising voltage dividing resistances and the voltage signal(s) inputted from the processor 23, and outputs a controlling signal(s) to the chopper circuit 13, thereby the high voltage rectifier smoothing circuit 16 is controlled, and voltage charged in the condenser 17 is controlled so as to obtain a desired amount of the flash emitted from the flash discharge lamp 1.

According to the present invention, it is possible for the radiant heating apparatus to detect discharge current by the current detecting sensor 21. Further it is possible to control voltage charged in the condenser 17 based on the detected value. Therefore, even though the capacity of the condenser 17 drops, it is possible to obtain desired light output from the flash discharge lamp 1 by compensating the capacity drop and furthermore it is possible to properly heat-treat workpieces such as semiconductor wafers.

In the embodiments of the present invention, the voltage to be charged in the condenser 17 is controlled by sending the detected voltage signals from the processor 23 to the power source controlling circuit 25. However, as shown in FIG. 2, instead of providing the power source circuit 25, it is possible to provide a display circuit, thereby, it is possible to alert to an abnormal state such as deterioration of the condenser 17 by the display circuit 17 by sending controlling signals to the display circuit 26 when the pre-stored desired voltage value is compared with the detected voltage value and the detected voltage is lower than the desired voltage. The display circuit may include sound devices or light devices.

The disclosure of Japanese Patent Application No. 2001-398961 filed on Dec. 28, 2001 including specification, drawings and claims is incorporated herein by reference in its entirety.

Although only some exemplary embodiments of this invention have been described in detail above, those skilled in the art will readily appreciated that many modifications are possible in the exemplary embodiments without materially departing from the novel teachings and advantages of this invention. Accordingly, all such modifications are intended to be included within the scope of this invention.

What is claimed is:

1. A radiant heating apparatus for heating one or more workpieces comprising:

at least one flash discharge lamp;

a discharge circuit having a condenser, connected in series to said at least flash discharge lamp, for supplying voltage to said at least one flash discharge lamp; and a non-contact current detecting sensor provided in said discharge circuit wherein said current detecting sensor detects in a non-contact state discharge current flowing through said discharge circuit.

2. The radiant heating apparatus according to claim 1, further including a power source controlling circuit wherein said power source controlling circuit controls voltage charged in said condenser based on a value detected by said non-contact current detecting sensor.

3. The radiant heating apparatus according to claim 1, further including a display circuit wherein said a display circuit alerts to an abnormal state of said discharge circuit based on a value detected by said no-contact current detecting sensor.

4. A discharge current detecting circuit for a radiant heating apparatus that heats one or more workpieces by a flash emitted from at least one flash discharge lamp:

a condenser, connected in series to said at least flash discharge lamp, for supplying voltage to said at least one flash discharge lamp; and a non-contact current detecting sensor provided in said discharge circuit wherein said current detecting sensor detects in a non-contact state discharge current flowing through said discharge circuit.

* * * * *